United States Patent [19]

Genereux

[11] Patent Number: 5,272,656
[45] Date of Patent: Dec. 21, 1993

[54] SYSTEM AND METHOD OF PRODUCING ADAPTIVE FIR DIGITAL FILTER WITH NON-LINEAR FREQUENCY RESOLUTION

[75] Inventor: Ronald P. Genereux, Woonsocket, R.I.

[73] Assignee: Cambridge Signal Technologies, Inc.

[21] Appl. No.: 970,646

[22] Filed: Nov. 2, 1992

Related U.S. Application Data

[63] Continuation of Ser. No. 586,766, Sep. 21, 1990, abandoned.

[51] Int. Cl.⁵ ............................................. G06F 15/31
[52] U.S. Cl. ............................................. 364/724.19
[58] Field of Search ............... 364/724.01, 724.19, 364/724.20, 723, 728.01, 724.10, 724.12, 724.16, 724.18; 370/32.1; 381/103

[56] References Cited

U.S. PATENT DOCUMENTS

| | | | |
|---|---|---|---|
| 4,027,258 | 5/1977 | Perreault | 333/18 |
| 4,349,889 | 9/1982 | van den Elzen et al. | 364/724.19 |
| 4,377,793 | 3/1983 | Horna | 333/165 |
| 4,458,362 | 7/1984 | Berkovitz et al. | 381/103 |
| 4,628,530 | 12/1986 | Op De Beek et al. | 381/103 |
| 4,807,173 | 2/1989 | Sommen et al. | 364/724.18 |
| 4,845,758 | 7/1989 | Op De Beek et al. | 381/98 |
| 4,872,184 | 10/1989 | Yamaguchi et al. | 364/724.20 |
| 4,888,808 | 12/1989 | Ishikawa et al. | 351/103 |
| 4,903,247 | 2/1990 | Van Gerwen et al. | 364/724.18 |
| 4,995,030 | 2/1991 | Helf | 370/32.1 |
| 5,058,047 | 10/1991 | Chung | 364/724.19 |

Primary Examiner—Long T. Nguyen
Attorney, Agent, or Firm—Hale and Dorr

[57] ABSTRACT

A filter and method of adapting a digital filter provides a single fixed finite impulse response (FIR) filter adaptively from measured data, in a manner whereby the filter's frequency and time resolution can be controlled. The resulting filter exhibits properties which allow it to be efficiently implemented in various multi-rate configurations. Specifically, the system and method produce an FIR filter with high resolution at low frequencies by having a large number of coefficients, but reduces resolution at higher frequencies by allowing only a fraction of the coefficients to adapt to the high frequency part of the signal. This is accomplished by using a multi-rate, segmented adaptation procedure, such that resolution and bandwidth are controlled independently at each state. If desired, the resulting filter can be made to approximate constant Q resolution. In addition, by adapting only a short part of the filter at a time, misadjustment is minimized.

18 Claims, 10 Drawing Sheets

SYSTEM AND METHOD OF PRODUCING ADAPTIVE FIR DIGITAL FILTER WITH NON-LINEAR FREQUENCY RESOLUTION

This is a continuation of copending application Ser. No. 07/586,766 filed on Sep. 21, 1990 now abandoned.

BACKGROUND OF THE INVENTION

The present invention relates to a filtering system and more particularly to an equalization system and method for utilizing adaptive digital filters with non-linear frequency resolution.

Quality audio products are designed with the goal of reproducing as accurately as possible at the listener's ears the acoustic signal originally recorded or broadcast. Yet despite the many improvements that have been made in audio technology in the past several years, there still remains at least one major obstacle to achieving that goal.

Room boundaries can have a significant effect on the sound radiated by a loudspeaker and eventually perceived by the listener. Reflections off walls and furniture combine at the listener's ears in a complex manner such that the various frequency components in the music are unbalanced, influencing the sound to a greater extent than any other component in the system. The problem is difficult to deal with because the extent of the problem can only be assessed by making a measurement of the system at the exact listening position.

A solution to the problem is to use adaptive digital filters to develop inverse filters for the loudspeaker/room response. The invertability of these system responses has been studied and numerous solutions have been proposed. Several of these solutions involve frequency domain transform techniques to design finite impulse response ("FIR") filters. Various configurations of time domain adaptive FIR filters have also been developed. Although adaptive infinite impulse response ("IIR") filters are also applicable, problems of convergence and stability generally make them less practical.

In most systems using inverse filters for equalization, one or more loudspeakers are located in a small to medium sized room such as a studio control room or domestic living room. During a separate calibration mode, a test signal is output through a loudspeaker and received at a microphone, located near, but by necessity not coincident to, the location of the listener's ears. Inverse filter coefficients are then generated from the measured transfer function. These coefficients are then transferred to a fixed digital filter for use in the playback mode, at which time the system processes the audio source material in real time.

Frequency response anomalies in a room are the results of the reinforcement and cancellation which occur when sound waves from various sources (i.e., direct and reflected) add together in and out of phase. It has been found that the average distance between pressure maxima in a room is about 0.9 times the wavelength. It follows that the level of high frequency sounds, with short wavelengths, will vary significantly between nearby points, while that of the longer wavelength low frequencies will be less position sensitive.

This issue is generally ignored in applying equalization, but becomes extremely important as the resolution and accuracy of the inverse correction filter improves. Since a listener must use two ears, generally separated by about 20 cm, it is not physically possible to provide perfect equalization across the full audio band at both ears simultaneously. This clearly suggests that while low frequencies may be corrected quite accurately, higher frequencies must be treated differently.

To further complicate the issue, the auditory system has the ability to discriminate direct sound from later reflections, as well as the ability to detect the direction from which a sound is coming. It also perceives tones on a logarithmic frequency scale, rather than the linear range in which adaptive filters operate. While the ability to generate very accurate equalization filters is one of the goals of the known adaptive systems, i.e., minimize an error in the least mean squared sense, it is not necessarily correct from psychoacoustic criteria.

From the above discussions, it is clear that improvements over the current state of the art require a means for more effectively controlling filter accuracy as a function of frequency and space. Existing techniques approach the problem by either controlling the resolution of the filter directly, as in U.S. Pat. No. 4,628,530 to Philips, or with a multi-band approach, using high resolution digital filters for low frequencies, and low resolution analog or digital filters at high frequencies. Current means of implementing this multi-band approach require that the signal to be equalized be split into two or more frequency bands and operated on by parallel filters. This has several disadvantages. First, since there is no interaction between the filters in the various bands, it makes the adaptation of the filters difficult. Secondly, the additional processing steps of band splitting and recombination distort the signal and introduce noise into the system.

Figure 1:
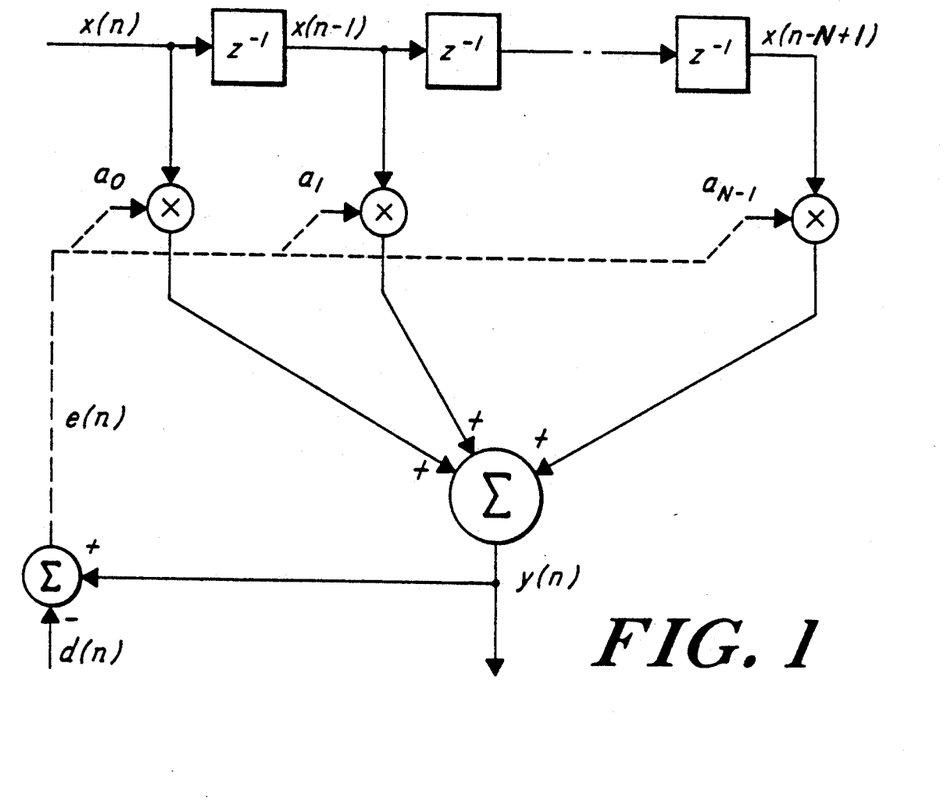
FIG. 1 is a schematic view of an adaptive FIR filter.

Referring to FIG. 1, the basic structure of a known adaptive FIR filter is shown. The output of the filter y(n) is the linear combination of current and delayed signal values x(n−i) scaled by the filter coefficients ai, where $0 \leq i \leq N-1$, with N being the number of signal values, i.e.

$$y(n) = a_0 x(n) + a_1 x(n-1) + \ldots + a_{N-1} x(n-N+1)$$

The filter coefficients a0 to aN-1 are updated based on an error signal e(n), which is the difference between the filter's output y(n) and a reference signal d(n). Any known method may be used for performing this update including those described in "Adaptive Signal Processing", edited by L. H. Sibul, 1987 IEEE Press, New York. Such known methods typically attempt to minimize some function of the error signal e(n). The coefficient update equation for the LMS algorithm is (with K being the convergence factor):

$$a_i(n+1) = a_i(n) + K\, e(n)\, x(n-i)$$

By choosing an appropriate input and reference signal, this technique can be used to adaptively design digital filters with responses matched to the given signals.

Figure 2:
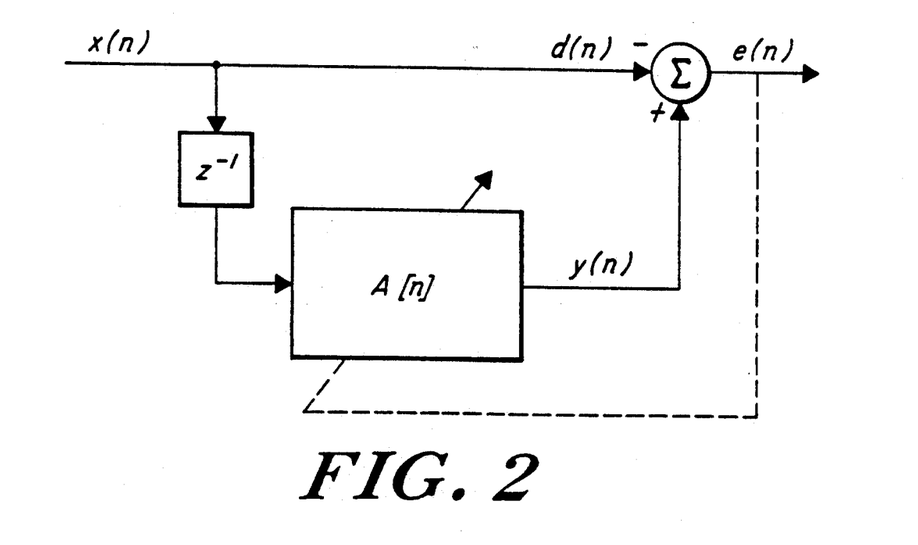
FIG. 2 is a schematic view of a linear predictor equalizer.

FIG. 2 illustrates a predictive filter structure used for equalization, which is described in U.S. Pat. No. 4,458,362 issued to Berkovitz et al. Here the filter A(n) is updated based on the error between the current input signal sample and its predicted value y(n). If x(n) is the output of a system driven by a "white" sequence, it can be shown that the resulting filter is an inverse of the system response, with properties suitable for use as an equalizer.

A digital filter's frequency resolution is directly proportional to its length. If we define resolution to be the minimum 3 dB feature bandwidth, and assume that an adapted FIR filter represents a rectangularly windowed version of an optimal Infinite Impulse Response (IIR) filter, then $$f_{res} = 0.89 \times f_s/N$$

where fres is the resolution in Hertz, $f_s$ is the sampling frequency in Hertz, and N is the total number of FIR filter coefficients.

For high quality audio applications, a common sampling frequency is 44,100 $H_z$. For the filter to have better than 20 $H_z$ resolution, which would be needed for satisfactory equalization at low frequencies, N must be greater than 1960. However, in typical audio applications, this resolution is required only at very low frequencies, which is a small fraction of the total signal bandwidth $f_s/2$. For most adaptive algorithms such a long filter introduces computational difficulties. In the case of algorithms such as the LMS, the problem is one of convergence and "misadjustment" due to algorithm noise. This leads to a significant disparity between the adaptive filter and the theoretical optimal filter.

It is therefore a principal object of the present invention to provide inverse filters whose accuracy can be controlled as a function of frequency.

An additional object of this invention is to provide a method for accurately adapting an FIR filter when a large number of filter taps are required to obtain adequate frequency resolution.

Yet another object of this invention is to provide an efficient means for implementing long FIR filters which do not introduce amplitude or phase distortions into the response by band splitting and recombination.

SUMMARY OF THE INVENTION

The system and method of the present invention provides a means for designing a single fixed FIR filter adaptively from measured data, in a manner whereby the filter's frequency and time resolution can be controlled. The resulting filter exhibits properties which allow it to be efficiently implemented in various multi-rate configurations.

The system and method of the present invention exploits several properties of FIR filters to solve the problems associated with prior art systems. The underlying principle is the duality which exists between the time and frequency responses, i.e., narrow time domain events have broad frequency domain components, while narrow frequency domain features are correspondingly long time domain events. Specifically, the system and method produce an FIR filter with high resolution at low frequencies by having a large number of coefficients, but reduces resolution at higher frequencies by allowing only a fraction of the coefficients to adapt to the high frequency part of the signal. This is accomplished by using a multi-rate, segmented adaptation procedure, such that resolution and bandwidth are controlled independently at each stage. If desired, the resulting filter can be made to approximate constant Q resolution. In addition, by adapting only a short part of the filter at a time, misadjustment is minimized.

These and other features and objects of the present invention will be more fully understood from the following detailed description which should be read in light of the accompanying drawings in which corresponding reference numerals refer to corresponding parts throughout the several views.

DETAILED DESCRIPTION OF THE PREFERRED EMBODIMENTS

The basic principle set forth in the description that follows is the segmentation of an adaptive filter in both the time and frequency domains for the purpose of controlling the resolution of the resulting filter. This is accomplished by sequentially adapting portions of the final filter to data at different sampling rates, and using interpolation techniques to make the transition between different rates. The method is meant to be applied where adaptive filtering techniques are used to design time-invariant filters from measured data, such as equalizers.

For purposes of illustration, the system and method of the present invention will be described in an embodiment using the LMS adaptive algorithm in a predictive equalization filter configuration. Those skilled in the art will recognize that the technique can be applied to other filter configurations and adaptive algorithms in a straightforward extensions of the basic principles involved. The method as described requires several operations to be performed sequentially, but except for the sampling of signals, they need not be performed in real time. In the preferred embodiment, half-band decimation and interpolation are used when discussing sampling rate conversions, since these lend themselves well to producing the quasi-constant-Q resolution desired. However, any other integer or non-integer ratio can be equally applicable, and is not meant to be excluded from other embodiments.

Figure 16:
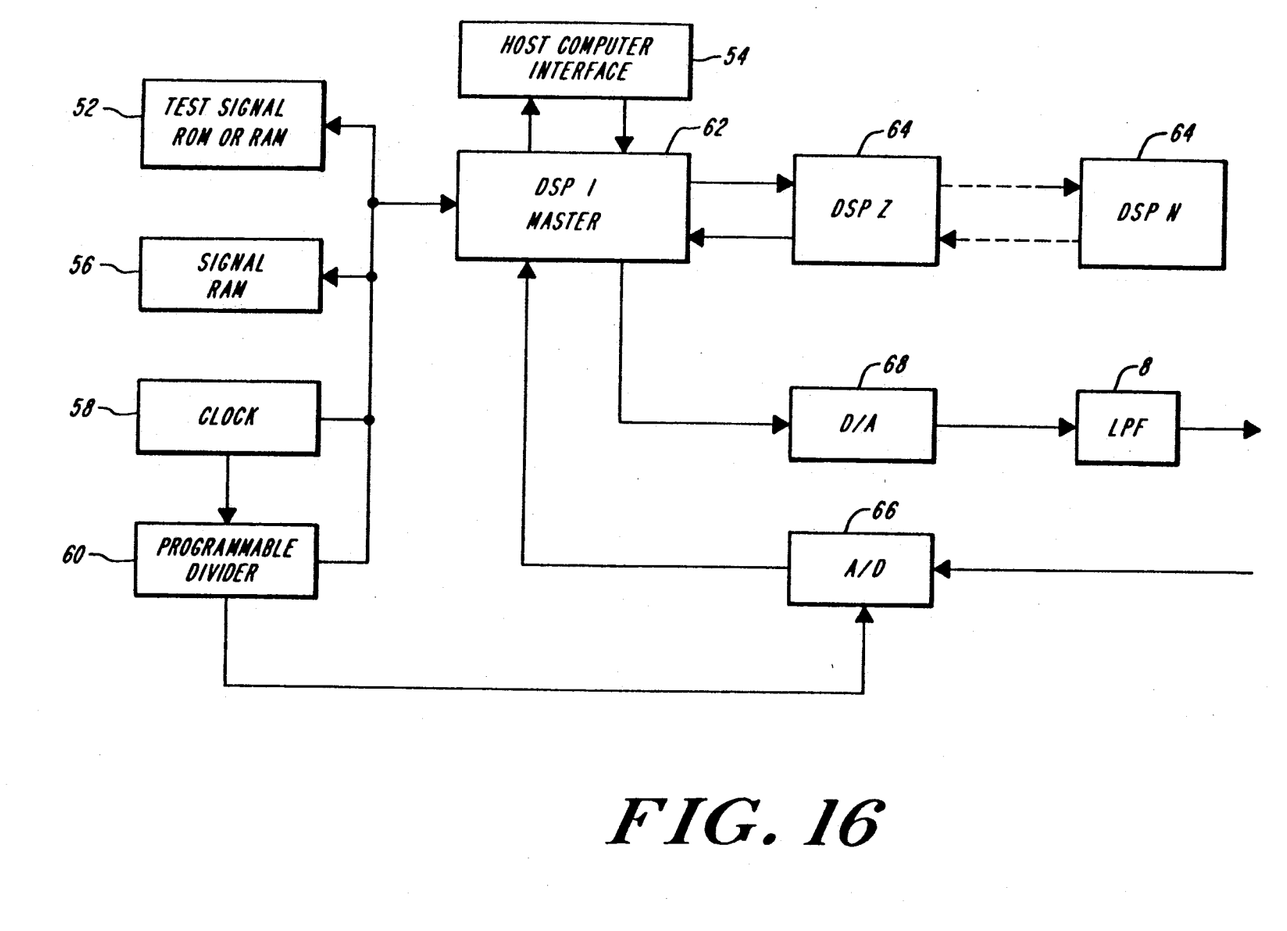
FIG. 16 is a schematic diagram of the components of the present invention.

Referring now to FIG. 16, the embodiment of the hardware used to implement the adaptive filter and method of the present invention will now be described. A ROM or RAM 52 is used for storing test signals and is down loaded from a host computer (not shown). A signal RAM 56 is used for storing signals during processing and a suitable RAM would be the Motorola MCM 6164. A clock 58 operates at a frequency which is a multiple of the desired system sampling frequencies and a program divider 60 generates various sampling frequencies from the clock 58. A digital signal processing microcomputer 62 controls the operation of the system of the present invention by executing various signal processing operations, control and input output functions. Example of a suitable digital signal processor is the Motorola DSP 56001. Secondary digital signal processors 64 operate in parallel to provide the necessary computational power and a suitable processor would be the Motorola DSP 56200. A Sigma-Delta type analog digital converter 66 operates at various sampling frequencies and an antialiasing filter and sample and hold circuit are an inherent part of the Sigma-Delta design and a suitable device can be obtained from Motorola under the designation 56ADC16. A digital to analog conversion system 68 includes a digital interpolation filter such as the Philips NPC5803 and the Analog Devices AD1864. A Bessel type low pass filter 70 is used to remove the high frequency components from the output signal. An optional interface 54 to the host computer 62 may also be used.

The system and method operate as follows. Given that the equalization filter is to operate over a total bandwidth of Ω Hz, then the sampling rate, $f_{samp}$, is chosen such that $$f_{samp} \geq 2\Omega$$

in accordance with the well known Nyquist criterion for sampled signals. The total filter length N is determined by the minimum desired low frequency resolution, $f_{Ores}$ of the filter according to the relationship:

$$N = (0.89 \times f_{samp})/f_{Ores}$$

The filter is then constructed from a set of adaptively-derived segments, such that the frequency resolution varies as a function of frequency. The term "segment" is used here instead of "band" to differentiate the method of the present invention from that of conventional frequency band splitting, since the present filter is being limited in both the time and frequency domains. The filter may then be implemented in a conventional FIR filter structure, or in a preferred embodiment, as a parallel structure which exploits the special time-frequency relationship inherent in the coefficients, as discussed below and shown in FIG. 7.

The table below illustrates the relationships between the various parameter of adaptation for the most general case.

| Segment | Freq. Range | Sampling Frequency | Segment Length | Combined Length | Resolution |
|---|---|---|---|---|---|
| 0 | 0 to $f_1$ Hz | $2f_1$ Hz | $p_0$ | $n_0$ | $f_{Ores}$ |
| 1 | $f_1$ to $f_2$ Hz | $2f_2$ Hz | $p_1$ | $n_1$ | $f_{1res}$ |
| 2 | $f_2$ to $f_3$ Hz | $2f_3$ Hz | $p_2$ | $n_2$ | $f_{2res}$ |
| : | : | : | : | : | : |
| i | $f_i$ to $f_{i+1}$ | $f_{isamp}$ Hz | $p_i$ | $n_i$ | $f_{ires}$ |
| : | : | : | : | : | : |
| J | $f_J$ to $f_{samp}/2$ | $f_{samp}$ | $p_J$ | $n_J$ | $f_{Jres}$ |

The segment i is defined in terms of frequency range and resolution, and those parameters determine minimum values for the segment adaptation length $p_i$, total length $n_i$, and the sampling frequency $f_{isamp}$. The segment adaptation length $p_i$ is determined as follows:

$$p_i \geq \frac{0.89 \, f_{isamp}}{f_{ires}}$$

Note that for ease of implementation, each intermediate sampling frequency should be an integer submultiple of $f_{samp}$. Further computational efficiency can be achieved by using half-band processing at each stage, which results in the parameter relationships shown in the following table.

| Seg. | Frequency Range | Sampling Frequency | Segment Length | Combined Length | Resolution |
|---|---|---|---|---|---|
| 0 | 0 to $f_{samp}/2^{J+1}$ | $f_{samp}/2^J$ | $p_0$ | $n_0$ | $f_{Ores}$ |
| 1 | $f_{samp}/2^{J+1}$ to $f_{samp}/2^J$ | $f_{samp}/2^{J-1}$ | $p_1$ | $2n_0$ | $f_{1res}$ |
| 2 | $f_{samp}/2^J$ to $f_{samp}/2^{J-1}$ | $f_{samp}/2^{J-2}$ | $p_2$ | $4n_0$ | $f_{2res}$ |
| : | : | : | : | : | : |
| J | $f_{samp}/4$ to $f_{samp}/2$ | $f_{samp}$ | $p_J$ | $2^J n_0$ | $f_{Jres}$ |

Figure 3A:
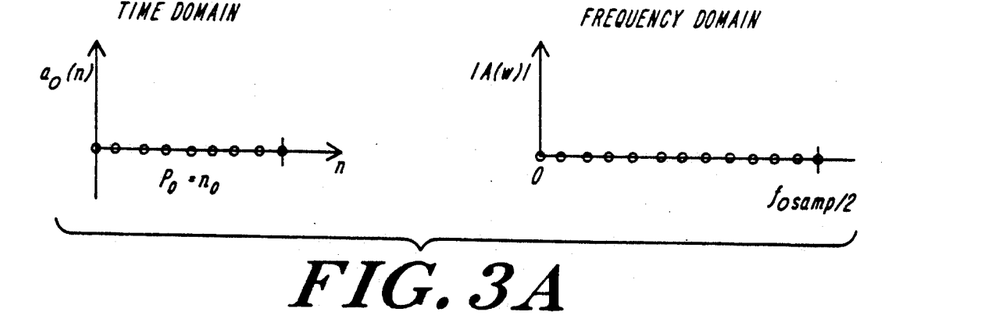
FIG. 3(a)–3(d) are graphs of time domain and corresponding frequency domain results from operation of the method of the present invention.
Figure 3B:
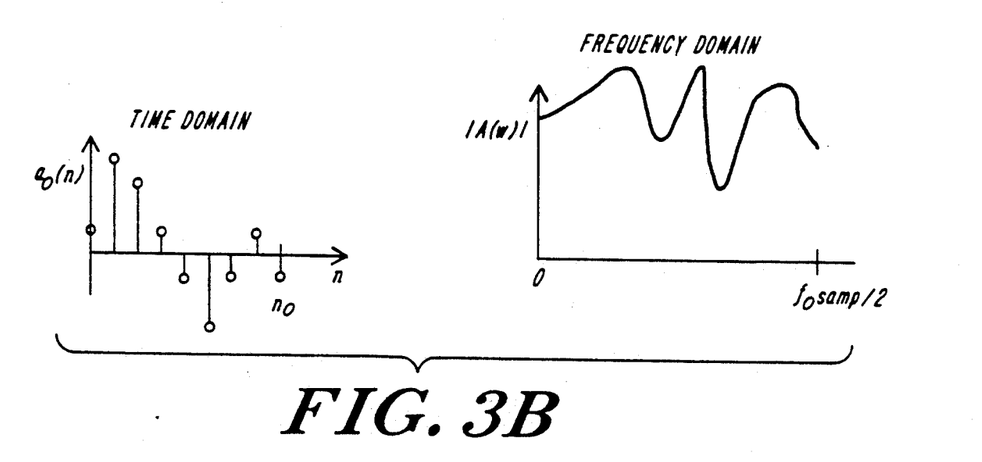
Figure 3C:
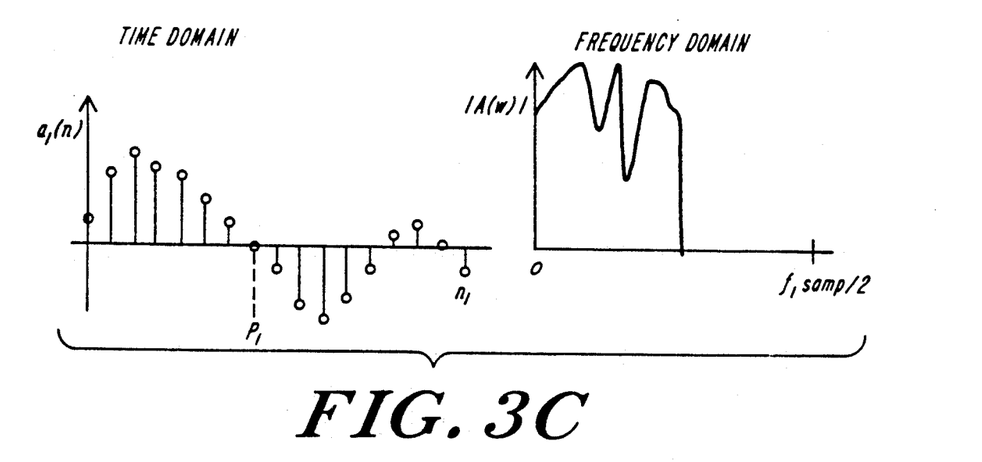
Figure 3D:
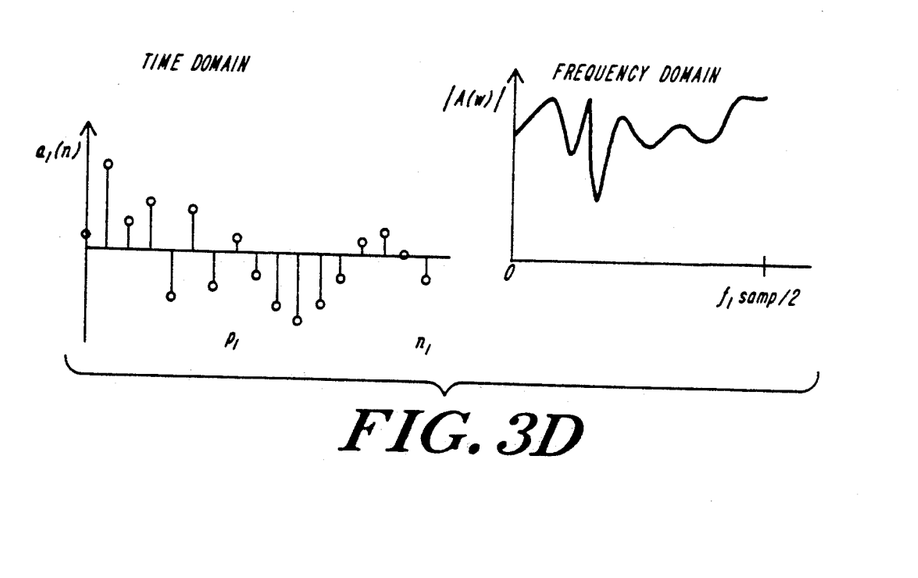

Briefly, the following steps are involved in the adaptation process. Both the time domain and corresponding frequency domain results for these steps are shown graphically in FIGS. 3a–3d. In the first step, all $n_0$ coefficients of the first segment are set to zero, as shown in FIG. 3a. Typically, $n_0$ is equal to $p_0$ in the first segment adapted. The coefficients are adapted according to any chosen adaptive algorithm, operating on input data sampled at the appropriate sample rate $f_{0samp}$. The resulting $n_0$ coefficients, shown in FIG. 3b, comprise the first segment. The filter is then interpolated by a factor L to length $n_1$ and scaled, forming the $n_1$ total filter coefficients at that stage, comprising the $p_1$ coefficients to be readapted, plus the interpolated tail representing the lower frequency response of resolution $f_{Ores}$, as shown in FIG. 3c. The second segment consists of the first $p_1$ values readapted according to the chosen algorithm, this time with input data obtained at L times the previous sample rate. The results of this are shown in FIG. 3d. Subsequent segments are obtained by repeating this sequence of basic operations; the entire adaptive process is described below in more detail for the half-band case following the discussion of several related issues.

Figure 4:
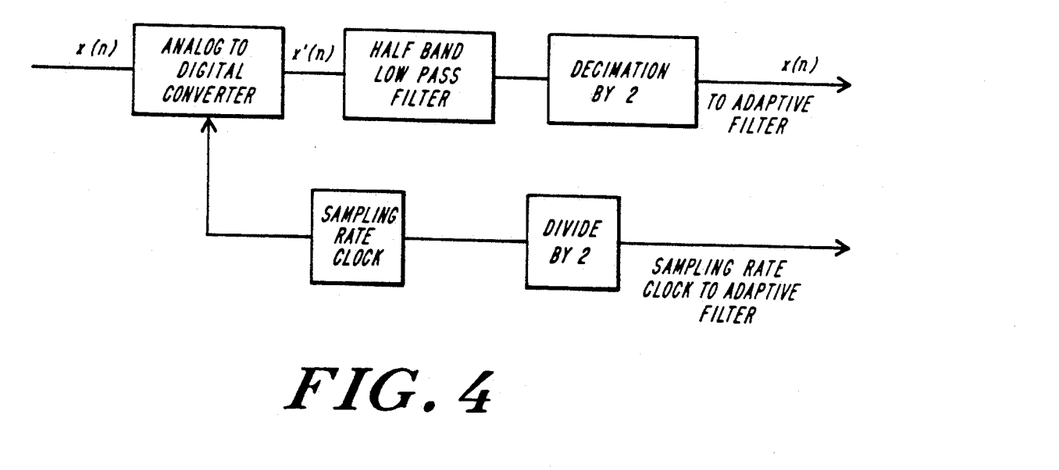
FIG. 4 is a schematic diagram showing the steps in the removal of the sampling artifacts from data.

For all segments but the last, it is necessary that the sampled data be free of artifacts such as DC bias introduced by the analog to digital converter, and other sampling related artifacts which would not appear if the signal is sampled at the $f_{samp}$ rate. One such important artifact is caused by the antialiasing filters in the Analog to Digital converters. This introduces an attenuation of the high frequency signal content of the band and a corresponding phase shift. It must not be present in the data used by the adaptive filter, because the filter will adapt to those characteristics and consequently be in error in subsequent segments, where such artifacts are not present. If the adaptation is performed in real time, then it is necessary that the Analog to Digital converter oversample the data by a factor of two, the resulting digitized samples processed through a half band filter and decimated by a factor of 2, with the output used by the adaptive filter. This is shown schematically in FIG. 4. If the adaptation procedure is being performed in non-real time using previously sampled and stored data, then the data may be sampled at the higher rate and post processed in a similar manner to obtain equivalent results.

The length of the sampled data sequences which are processed by the filter during adaptation must be sufficient to allow the filter to converge for the given filter length chosen adaptation algorithm. The parameters which affect this are algorithm specific, but well known to those skilled in the art. For the example described here using the LMS algorithm, the convergence factor K is initially chosen to be near its maximum allowable value for stable behavior, a value which can be calculated from the total energy in the signal and the number of adapting coefficients in the filter using well-known relationships. Then, in order to minimize misadjustment, K is scaled by a constant less than but very close to 1.0 after each sampling interval. When the value of K becomes small enough that adaptation of the coefficients essentially ceases, then the process may be terminated, and the adapted filter coefficients used as the results of the current segment. If the adaptation is performed in non-real time using stored samples, a significant savings in memory may be achieved if a minimum data set is initially sampled and stored, then cycled through repeatedly while the convergence constant is reduced as described above. In this case the data sample size should be at least twice the total filter length $n_i$ of the segment being adapted.

When the filter is used in the embodiment of an equalizer, the test signal must be chosen carefully so that a correct inverse filter can be generated. Specifically, the test signal must have a white spectrum and be uncorrelated, and in particular, this property should be ensured in a finite number of samples. This can be achieved by using a maximum length sequence, or preferably obtained by creating a sequence with the desired properties using an inverse Fourier Transform method. In this latter method, the magnitude of the frequency transform will be specified, and the phase component of the transform will be generated from a sequence of random numbers between $+\pi$ and $-\pi$. In order to generate a real function, the real part of the transform is made symmetric about 0, and the imaginary part anti-symmetric. By applying an inverse transform to this data, such as is available using well known Fast Fourier Transform techniques, a time domain signal which is a power of 2 in length and has the desired spectral properties will be generated. A further advantage of using such a method is its ability to generate any arbitrary spectral shape, which can be used to superimpose a desired spectral shape on the equalization filter. This is accomplished by designing the test signal noise to have the inverse characteristic other than white, specifically that of the desired post equalization spectrum.

Since sample-by-sample adaptive algorithms such as the LMS never actually achieve the optimal solution for the coefficients at any given sampling interval, but rather do so only in the mean, performance may be improved by obtaining the mean using the following processing steps. Once algorithm convergence has been achieved, R additional samples are processed with a value of K several times greater than its final previous value. After each of the samples are processed and coefficients updated in the chosen manner, the filter coefficients are copied from the adaptive filter and added into a suitable external memory array for the purposes of averaging. After all R samples have been processed, the coefficient sums in the memory array are each divided by R to obtain their average value, and these are then used as the coefficient results of the current segment.

Once filter coefficients are obtained from the adaptation of the current segment, they must be further processed in order to be used as initial conditions for the next segment of the filter. First the coefficients are interpolated to the new sampling rate $f_2 = L \times f_1$ using well known techniques employing linear phase FIR low pass filters with normalized cutoff frequency of $\pi/L$ and unity passband gain. For this example $L=2$ (half-band case) as noted earlier. The lowpass interpolation filter may be designed using any of the well-known techniques for designing FIR filters. A particularly straightforward method is that of the window-function technique, described in most texts on digital filter design. For this application, the length of the interpolating filter M must be odd and the quantity $(M-1)/(2L)$ an integer in order for the interpolation filter delay to be removed. Examples of typical values for M are 41, 61 and 253 for $L=2$.

Interpolation of the segment filter coefficients is accomplished by inserting $(L-1)$ zero value coefficients between each of the original coefficients, and appending $[(M-1)/2]-1$ zeroes to the end, then convolving the resulting $Ln_i+[(M-1)/2]-1$ coefficients with the M lowpass filter coefficients. The first $[(M-1)/2]-1$ samples of the results, representing the interpolation filter delay, are then removed, resulting in a new filter of length $n_{i+1} = Ln_1$ and sampling rate $Lf_{i+1}$ Hz. The resulting filter coefficients represent a filter which has the identical frequency response of the original filter in the lower $1/L$ part of its band, and a low pass characteristic above.

Since each segment is adapted independently and without knowledge of subsequent segments, and in particular the relative spectral balance between segments, it is necessary to scale the interpolated coefficients before using them in the next segment in order to allow proper gain relationships to be established during adaptation. This is accomplished by multiplying each of the interpolated coefficients by a gain factor $G \leq 1.0$. In the simplest implementation, this can be a fixed constant for all segments. For the case of the predictive equalizer of this example, a value of 0.9 has been empirically found to yield good results.

An analysis of the spectral matching properties of adaptive linear predictive filters shows that the gain term is proportional to the mean-square value of the prediction error. This leads to a more robust method of determining G for each segment, although it requires additional computations. In this method, G is computed as the ratio of the mean-square prediction error to that of the mean-square signal value for the segment about to be adapted. Referring to FIG. 2.

$$G = \frac{\sqrt{E[e^2(n)]}}{\sqrt{E[x^2(n)]}}$$

These values can be obtained by processing sampled data for the next segment i through the predictive equalizer at the sampling rate $f_{isamp}$ Hz, using the interpolated but unscaled filter coefficients from the i−1 segment. Again referring to FIG. 2, samples of the unfiltered data x(n) are used in computing the mean-squared value of the input signal, while values of e(n) are used to compute the mean-square value of the prediction error.

Figure 5:
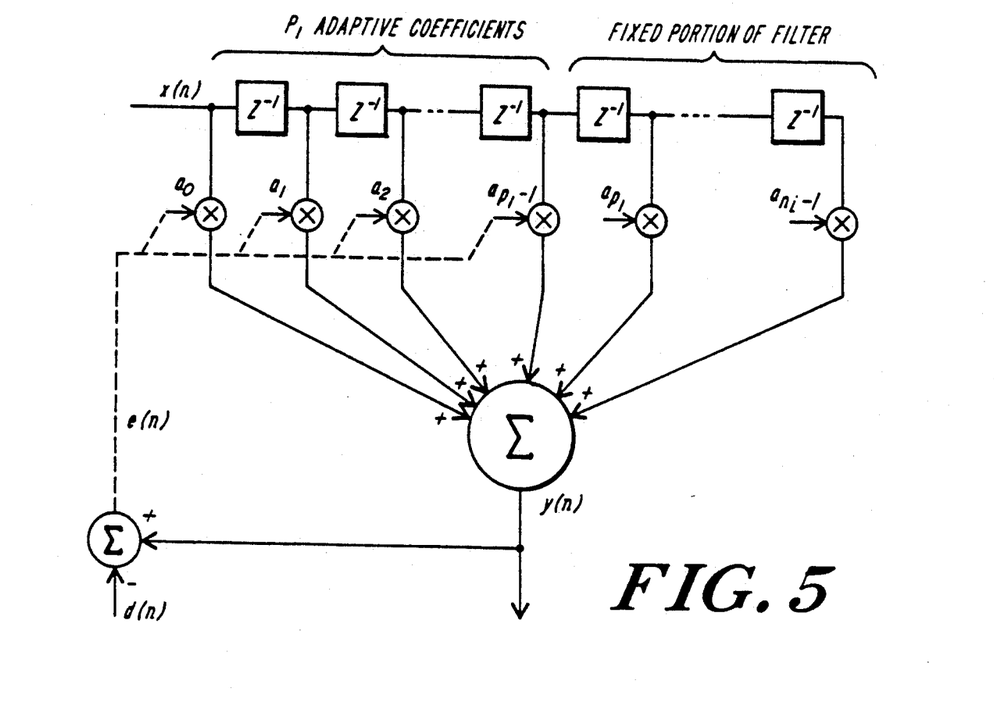
FIG. 5 is a schematic diagram of an adaptive FIR filter of the invention.

The interpolated and scaled filter coefficients are then used as the initial condition for the next stage of adaptation. It is at this step that restrictions are imposed on the filter in order to control resolution. For the case of segment 1, by constraining the filter to adapt only the first $p_1$ coefficients, and keeping the remaining $[n_1-p_1]$ coefficients constant at the interpolated and scaled values, the filter's resolution in the frequency band $f_1$ to $f_2$ is limited to $f_{1res}=1.78f_2/p_1$. The adaptation process essentially converts the lowpass characteristic of the initial filter coefficients into the desired characteristic within that band, as is shown in FIGS. 3(a)-3(d). This stage of the process can be considered to be equivalent to an adaptive filter of $p_1$ coefficients in cascade with a fixed FIR filter whose first $p_1$ coefficients are 0 and remaining $[n_1-p_1]$ are those of the interpolated filter. This is shown schematically in FIG. 5. Viewed in this manner, other configurations leading to the same results can be developed. Because the actual number of coefficients adapted during each segment remains relatively small, algorithm misadjustment is minimized, as are other computational complexities associated with a large number of adaptive coefficients.

The adaptation, interpolation and scaling steps are repeated for each of the remaining segments, with the resolution at each stage being controlled by limiting adaptation to only the first $p_k$ coefficients. For the final segment, adapted at the sampling rate $f_{samp}$, the coefficients resulting from the adaptation process are neither interpolated nor scaled, and become the final results of the procedure.

Figure 6:
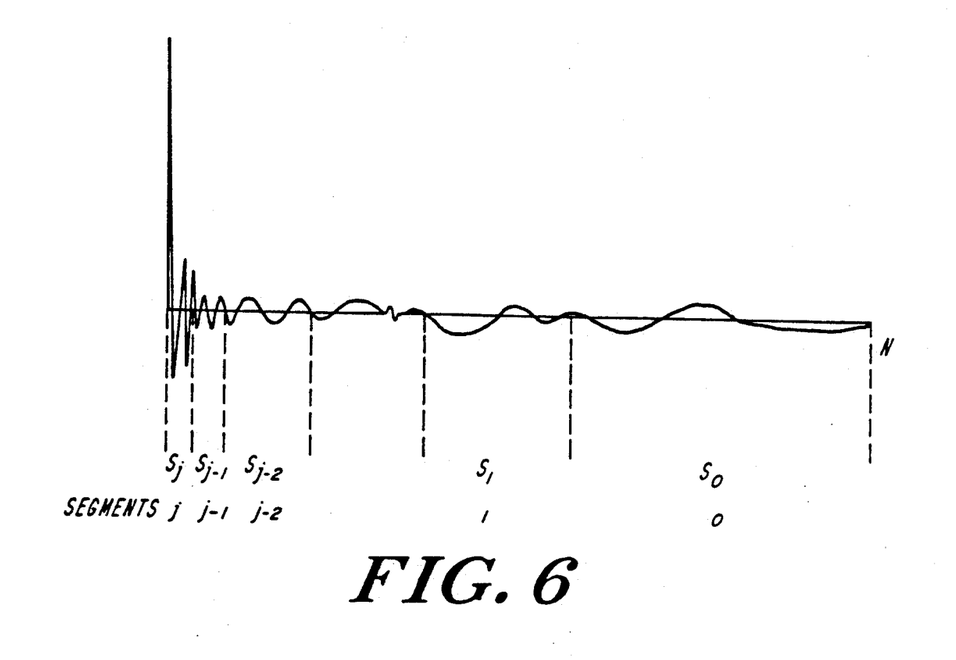
FIG. 6 is an impulse response of an equalization filter using system and method of the present invention.

The filter which results from this process has unique properties which can be exploited to reduce the computational requirements of implementing the filter in real time. FIG. 6 is an example of a filter adapted in the manner described above. Generally, the desired high frequency resolution is rather broad, and can be obtained with a relatively short filter. To obtain the desired high resolution at lower frequencies, a longer filter is required, but since the additional coefficients were adapted at rates less than the sampling frequency, they consequently can be implemented at lower rates. As can be seen, only the first $p_j$ coefficients, representing the last segment adapted, have any frequency content between $f_j$ and $f_{samp}/2$, and consequently affect the response of the filter in that frequency range. The remaining $N-p_j$ coefficients effect only the frequency range below $f_j$. The same can be seen for each of the adapted segments. It is important to note that because of the J−1 stages of interpolation undergone by the first segment, approximately half of the filter coefficients can be associated exclusively with the first segment.

Figure 7:
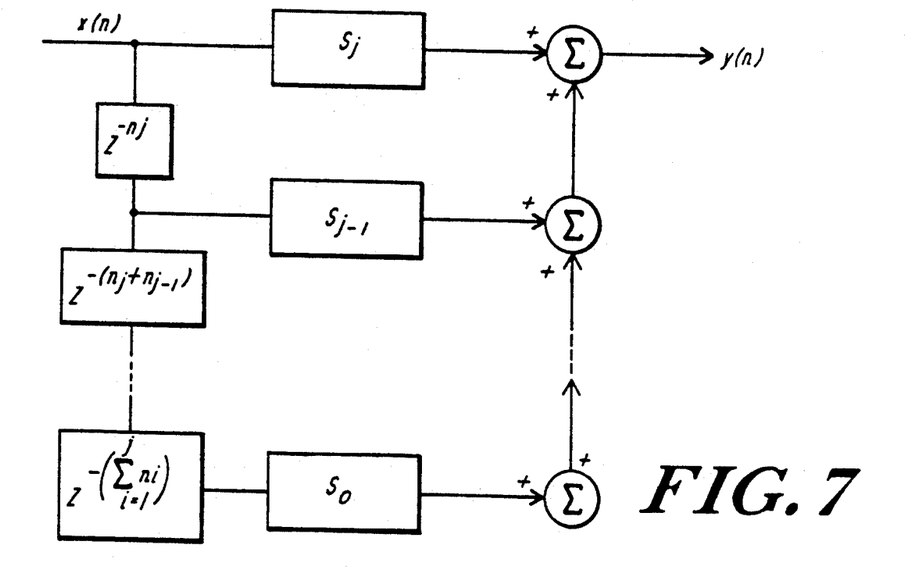
FIG. 7 is a parallel implementation of the filter of the present invention.

Alternatively, the filter can be decomposed into a bank of parallel filters, each of which is related to a segment of the original filter. Referring to FIG. 7, $S_j$ are the $p_j$ coefficients adapted during segment j, $S_{j-1}$ are the remaining $(p_j-1-n_j)$ adapted during segment j−1, and so on. Due to the manner in which each segment has been adapted and the structure of this implementation, each branch is band limited and delayed relative to the branch above it in the diagram. It is therefore possible to implement each branch at a correspondingly lower sampling rate than its predecessor. Furthermore, the required delay can be obtained as a natural consequence of the decimation and interpolation process. It is therefore possible to implement the segmented filter using a multi-rate hardware system, and most importantly, obtain the same filter response as would be achieved by the single direct form filter operating at the $f_{samp}$. This is a major improvement over prior art methods of multi-rate filter implementation, where compromises in the resulting filter response are necessarily introduced due to the fact that the delay and phase shift introduced by the decimation and interpolation process cannot be removed and are not related in any way to the filter response being implemented.

Figure 8:
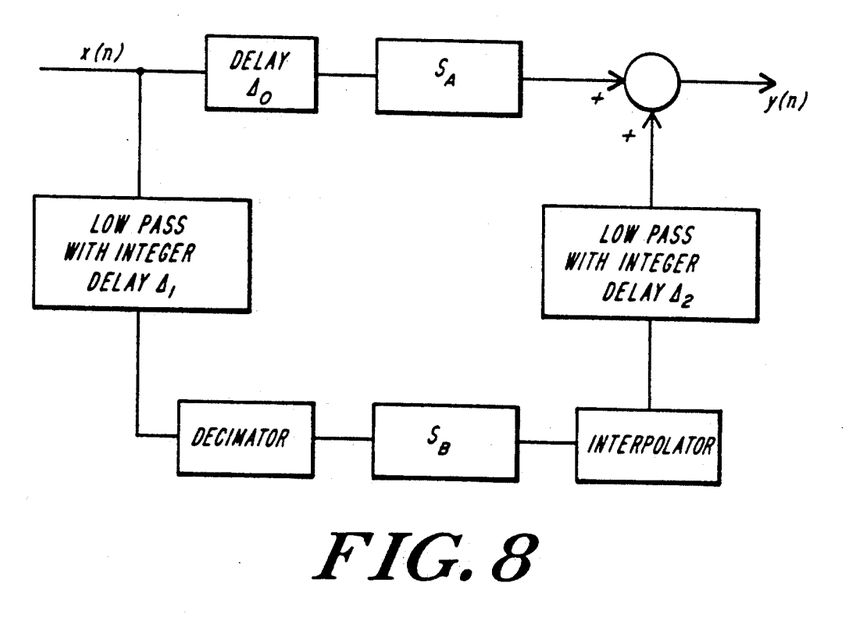
FIG. 8 is a two stage multi rate implementation of the filter of the present invention.
Figure 9:
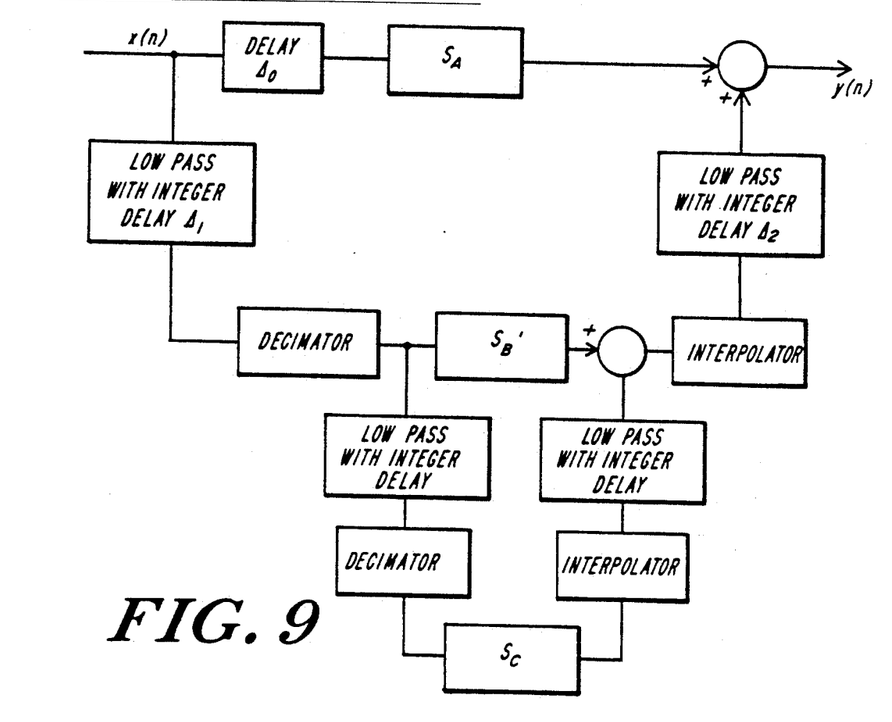
FIG. 9 is a schematic diagram of a three stage multi rate implementation of the filter of the present invention.

FIG. 8 shows a two stage multi-rate implementation of this kind. By properly designing the decimation and interpolation filters such that the sum of their delays $\Delta_1+\Delta_2$ equals $\Delta_0$ plus the required delay $p_j$, it is possible to exactly duplicate the impulse and frequency response of the original filter. Further savings are possible by extending this procedure further into a multi-stage implementation. FIG. 9 shows a three-stage implementation. As will be obvious to those skilled in the art, further extensions to greater than three stages may be desirable as a means of further reducing the computational load in real time applications and can be accomplished by extension of this technique.

The choice of lowpass filter characteristics will determine the amount of aliasing noise and distortion which is introduced by this multi-rate processing. For critical systems, such as audio equalizers, those skilled in the art will recognize the tradeoffs involved between filter length, transition band width, and stopband attenuation.

Figure 10:
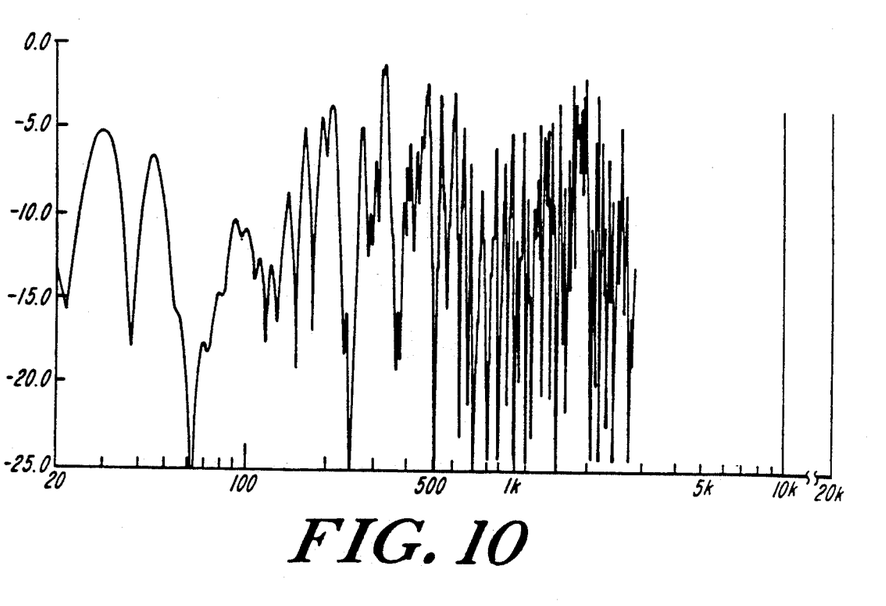
FIG. 10 is a graph of the band-limited loudspeaker/room response for which equalization is to be adapted using the system and method of the present invention.
Figure 11:
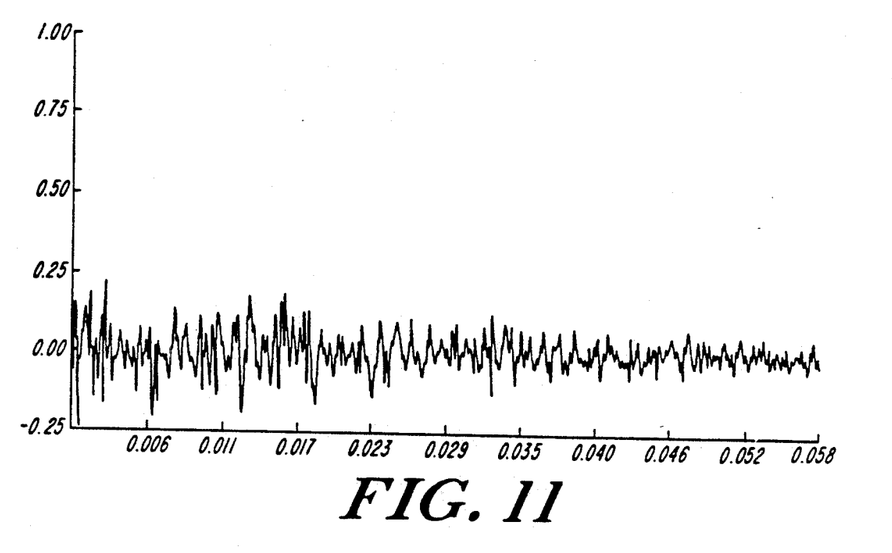
FIG. 11 is a graph showing the impulse response of a 320 coefficient Equalization filter adapted using a conventional LMS approach.
Figure 12:
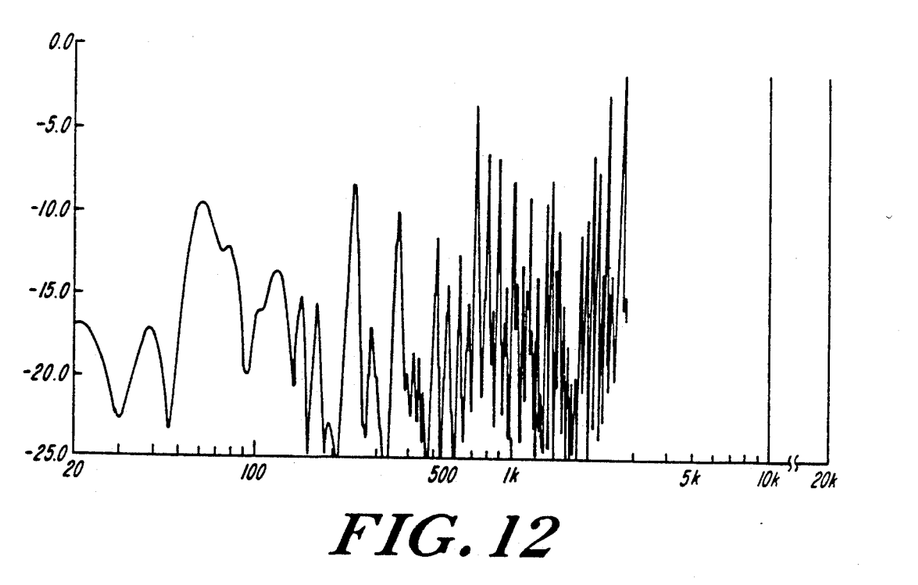
FIG. 12 is a graph showing frequency response of the filter whose time response is shown in FIG. 11.
Figure 13:
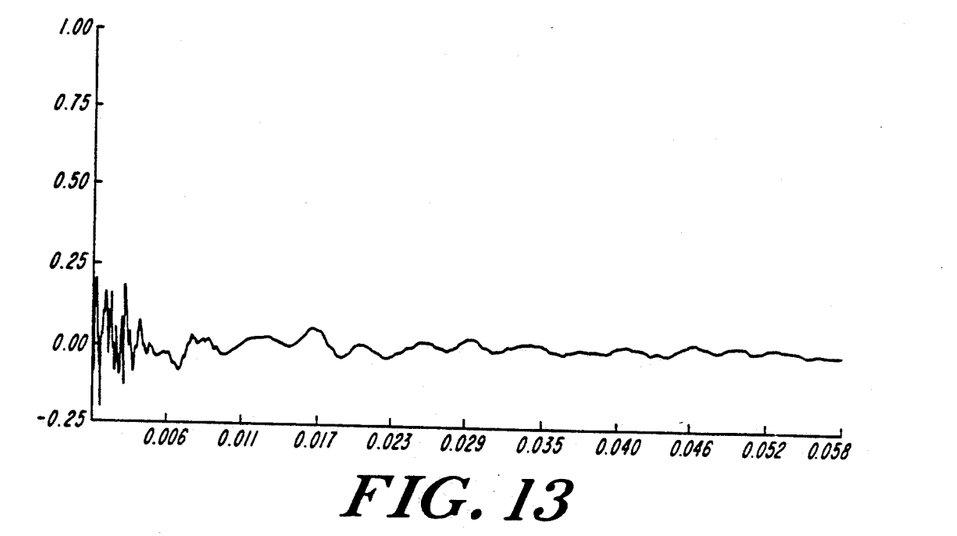
FIG. 13 is a graph of the impulse response of a 320 coefficient Equalization filter using the system and method of the present invention.
Figure 14:
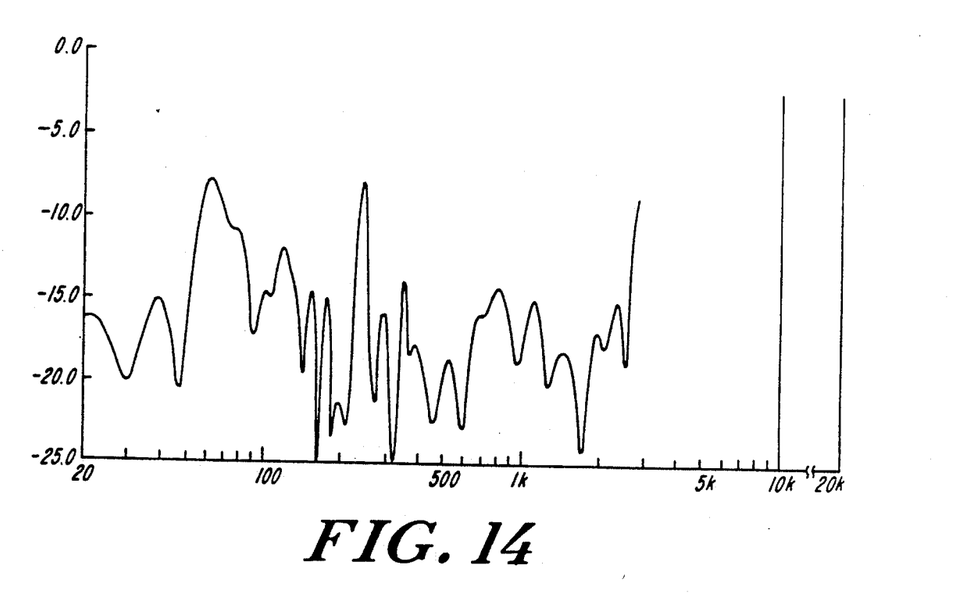
FIG. 14 is a graph of the frequency response of the filter whose time response is shown in FIG. 13.
Figure 15:
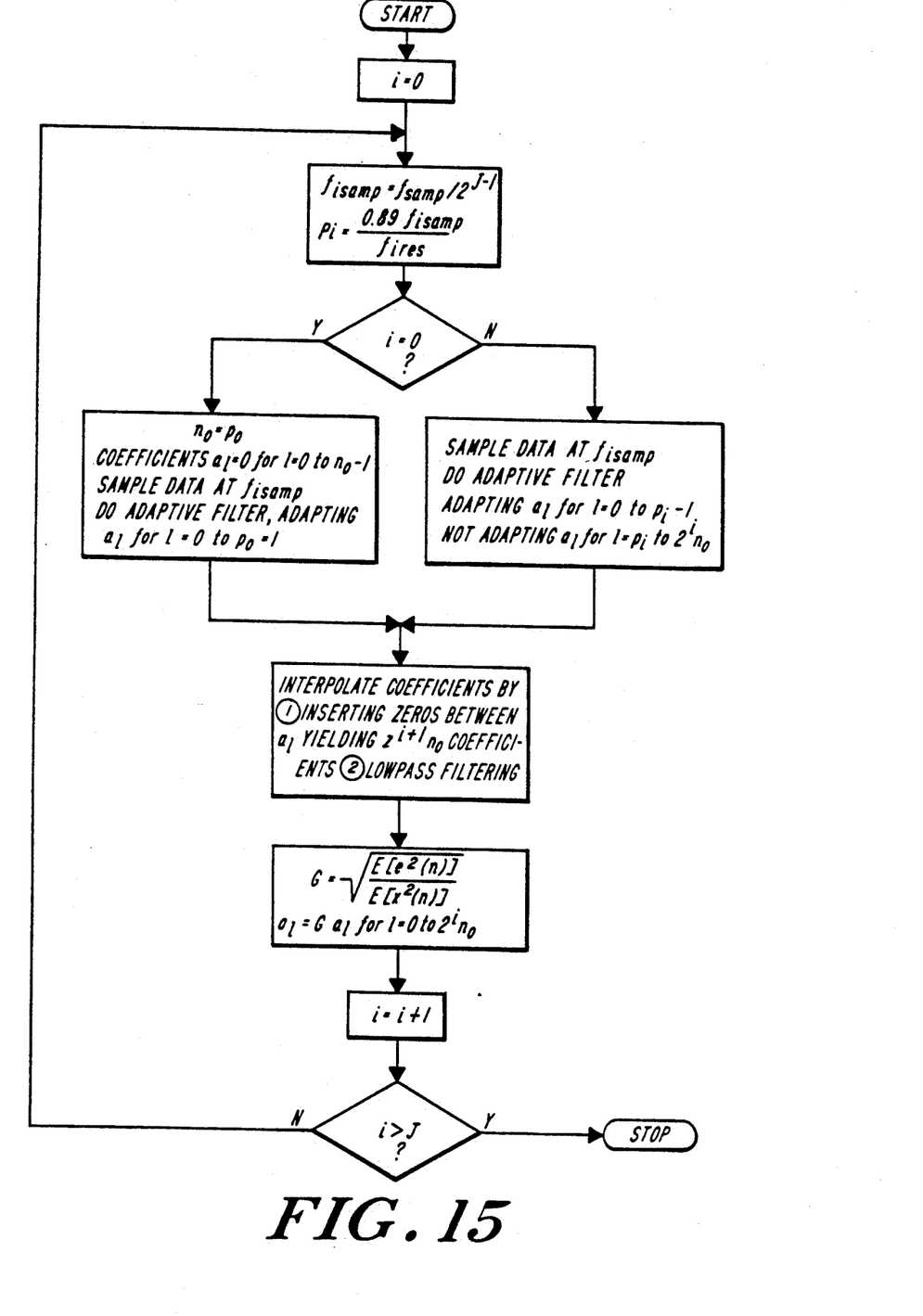
FIG. 15 is a flow chart for the method of the present invention performing half band processing.

The following example shows the results of the described method in adapting a loudspeaker/room equalizer of the type shown in FIG. 2. FIG. 10 shows the response to be equalized, and FIGS. 11 and 12 show the filter impulse and frequency response, respectively, for a 320 coefficient filter using conventional (i.e. single step) LMS adaptation. The filter has a resolution of approximately 15 Hz throughout the band. FIG. 13 and 14 show the results of a 4 segment adaptation using the method of the present invention. The parameters at each stage are given below, and are given for example only and not meant to represent any preferred implementation.

| segment | $f_s$ | # adaptive taps | resolution | freq. range |
|---|---|---|---|---|
| 0 | 689 Hz | 40 | 15.3 Hz | 0 to 345 Hz |
| 1 | 1378 Hz | 10 | 122.6 Hz | 345 to 689 Hz |
| 2 | 2756 Hz | 10 | 245.3 Hz | 689 to 1378 Hz |
| 3 | 5512 Hz | 20 | 245.3 Hz | 1378 to 2756 Hz |

While the foregoing invention has been described with reference to the preferred embodiments, various alterations and modifications will occur to those skilled in the art. All such alterations and modifications are intended to fall within the scope of the appended claims.

What is claimed is:

1. A method for generating coefficients of a digital filter of length N operating at a designated bandwidth such that frequency and time resolution characteristics of said filter are jointly controlled, said method comprising the steps of:
   a) providing target data related to a desired response of the filter;
   b) segmenting the filter into a plurality of contiguous time intervals, one interval segment operating over the entire designated bandwidth, and other time interval segments operating over increasingly restricted bandwidths, the lengths of each of said other time interval segments being selected to provide a desired resolution over the associated restricted bandwidth;
   c) iteratively adapting the filter such that at least a portion of each time interval segment is created at each stage from a correspondingly band-limited version of the target data.

2. A method for generating coefficients of a digital filter of claim 1 wherein said step of iteratively adapting comprises the steps of:
   a) initializing the adaptive digital filter to a predetermined value, said filter being of length $n_i$ and operating at sampling rate $2f_i$ Hz, the length $n_i$ being a submultiple of a target filter length N, and $f_i$ the upper limit of the frequency range over which a most band-limited segment is to operate;
   b) adapting $n_i$ digital filter coefficients to represent target data sampled at a rate of $2f_i$ Hz;
   c) interpolating said filter coefficients by a ratio of $L = f_{i+1}/f_i$ using a linar phase low pass filter with a normalized cutoff frequency of $\pi/L$.
   d) removing filter coefficients representing the interpolation filter delay to provide a new filter length $n_{i+1} = L\, n_i$;
   e) setting the adapted digital filter coefficients equal to the coefficients remaining after filter coefficients are removed in step (d) and repeating steps (b) through (d) for other segments i at the substrate $f_{i+1}$ Hz where $f_{i+1}$ is L times the sampling rate of the previous set of steps (b) through (d).

3. The method for generating coefficients of a digital filter of claim 1 wherein said selected filter length N is the length necessary to provide a desired low frequency resolution of said filter.

4. The method for generating coefficients of a digital filter of claim 1 wherein said interval segment is the initial interval segment.

5. The method for generating coefficients of a digital filter of claim 1 wherein said other time interval segments are successive time interval segments.

6. The method for generating coefficients of a digital filter of claim 1 wherein said target data is inversely related to a desired response of the filter.

7. The method for generating coefficients of a digital filter of claim 1 wherein said target data is directly related to a desired response of the filter.

8. The method for generating coefficients of a digital filter of claim 1 further comprising a step of selecting the filter length N prior to the step of segmenting the filter.

9. The method for generating coefficients of a digital filter of claim 1 further comprising a step of selecting a designated bandwidth over which the filter is to operate prior to the step of segmenting the filter.

10. An audio equalization system for filtering audio signals over a designated bandwidth in which filter coefficients are generated such that frequency and time resolution characteristics of the system are jointly controlled, said system comprising:
   a) means for receiving target data related to a desired response to the equalization system;
   b) means for segmenting the signals to be filtered into a plurality of contiguous time intervals, one of said time interval segments being of target length N and operating over the entire selected bandwidth, and other successive time interval segments operating over an increasingly restricted bandwidth, the lengths of the other of said successive time interval segments being selected to provide a desired resolution over the associated restricted bandwidth;
   c) means for iteratively adapting the equalization system such that at least a portion of each time interval segment is created at each stage from a correspondingly band-limited version of the target data.

11. The audio equalization system of claim 10 wherein said means for iteratively adapting comprises:
   a) means for initializing the audio equalization system so the audio equalization system filters signals over an interval signal length $n_i$ and operates at sampling rate $2f_i$ Hz, the length $n_i$ being a submultiple of a target filter length N, and $f_i$ the upper limit of the frequency range over which a most bank-limited segment is to operate;
   (b) means for adapting $n_i$ digital filter coefficients to representative target data sampled at a rate of $2f_i$ Hz; p1 c) means for interpolating said filter coefficients by a ratio of $L = f_{i+1}/f_i$ using a linar phase low pass filter with a normalized cutoff frequency of $\pi/L$;
   d) means for removing filter coefficients representing the interpolation filter delay to provide a new filter length $n_{i+1} = L\, n_i$;
   e) means for setting the filter coefficients equal to the coefficients remaining after filter coefficients are removed by said means for removing.

12. The audio equalization system of claim 11 wherein said means for iteratively adapting further comprises means for changing the sampling rate of $f_{i+1}$ Hz where $f_{i+1}$ is L times the rate of the previous step $f_i$ for each of the selected subrates.

13. The audio equalization system of claim 10 wherein said selected filter length N is the length necessary to provide a desired low frequency resolution of said filter.

14. The audio equalization system of claim 10 wherein said one interval segment is the initial interval segment.

15. The audio equalization system of claim 10 wherein said other time interval segments are successive time interval segments.

16. The audio equalization system of claim 10 wherein said target data is inversely related to a desired response of the audio equalization system.

17. The audio equalization system of claim 10 wherein said target data is directly related to a desired response of the audio equalization system.

18. A system for implementing a finite impulse response (FIR) digital filter in which filter coefficients are generated by segmenting the filter into a plurality of time segments, said system comprising:

means for receiving samples of at least a first and a second digital signal to be filtered;

calculating means for convolving said first digital signal with filter coefficients determined by segmenting the filter and adapting the filter from band-limited segments of target data;

means for band-limiting and convolving said second digital signal to a lower sampling rate;

means for converting said second digital signal to a higher sampling rate to restore the digital sample rate;

means for delaying said first digital signal to compensate for conversion of said second digital signal to higher and lower sampling rates;

means for summing the convolved said at least first and second and delayed digital signals into a single output signal.

* * * * *